(12) United States Patent
Sakuma et al.

(10) Patent No.: US 11,456,576 B2
(45) Date of Patent: Sep. 27, 2022

(54) METHOD FOR MANUFACTURING OPTICAL SEMICONDUCTOR DEVICE

(71) Applicant: Mitsubishi Electric Corporation, Tokyo (JP)

(72) Inventors: Hitoshi Sakuma, Tokyo (JP); Kazumasa Kishimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 105 days.

(21) Appl. No.: 16/927,950

(22) Filed: Jul. 13, 2020

(65) Prior Publication Data

US 2021/0119418 A1   Apr. 22, 2021

(30) Foreign Application Priority Data

Oct. 16, 2019   (JP) .............................. JP2019-189079

(51) Int. Cl.
| | |
|---|---|
| *H01S 5/20* | (2006.01) |
| *H01S 5/223* | (2006.01) |
| *H01S 5/22* | (2006.01) |
| *H01S 5/227* | (2006.01) |

(52) U.S. Cl.
CPC ............ *H01S 5/2081* (2013.01); *H01S 5/223* (2013.01); *H01S 5/2205* (2013.01); *H01S 5/2275* (2013.01); *H01S 5/2277* (2013.01); *H01S 5/2086* (2013.01); *H01S 5/2214* (2013.01)

(58) Field of Classification Search
CPC ....... H01L 33/005–0095; H01S 5/2086; H01S 5/22; H01S 5/2214; H01S 5/2215; H01S 5/2275; H01S 5/2081; H01S 5/2205; H01S 5/223; H01S 5/2277; H01S 5/2226

See application file for complete search history.

(56) References Cited

U.S. PATENT DOCUMENTS

| 2004/0069318 A1* | 4/2004 | Kanayama | ........ H01L 21/02046 134/1.3 |
| 2007/0086499 A1* | 4/2007 | Hino | ...................... B82Y 20/00 372/46.013 |

FOREIGN PATENT DOCUMENTS

| CN | 104140902 B | * | 1/2019 | ............... C11D 3/30 |
| JP | 2002-057142 A | | 2/2002 | |
| JP | 2006086498 | * | 3/2006 | ............. H01S 5/183 |
| JP | 2013-172059 A | | 9/2013 | |

* cited by examiner

*Primary Examiner* — Xinning(Tom) Niu
*Assistant Examiner* — Delma R Fordé
(74) *Attorney, Agent, or Firm* — Studebaker & Brackett PC

(57) ABSTRACT

A method for manufacturing an optical semiconductor device having a ridge stripe configuration containing an active layer and current blocking layers which embed both sides of the ridge stripe configuration, comprises steps of forming a mask of an insulating film on a surface of a semiconductor layer containing an active layer, forming a ridge stripe configuration by etching a semiconductor layer using gas containing SiCl$_4$, removing an oxide layer with regard to a Si based residue which is attached on a surface which is etched of the ridge stripe configuration which is formed and removing a Si based residue whose oxide layer is removed.

5 Claims, 5 Drawing Sheets

METHOD FOR MANUFACTURING OPTICAL SEMICONDUCTOR DEVICE

TECHNICAL FIELD

This application relates to a method for manufacturing an optical semiconductor device.

BACKGROUND ART

Regarding an embedded type semiconductor laser for communication which is an optical semiconductor device, in many cases, as a semiconductor layer containing an active layer, a ridge stripe configuration is used. At both sides of a ridge stripe configuration, current blocking layers which are layers of semiconductor are provided. The above mentioned configuration is formed so as to obtain characteristic stabilization and reliability stabilization by confining an active layer in a ride stripe configuration with semiconductor layers. In general, in a method for manufacturing an optical semiconductor device such as a semiconductor laser having a ridge stripe configuration, for forming a ridge stripe configuration, etching is performed using gas containing $SiCl_4$ with an insulating film as a mask.

By using gas containing $SiCl_4$, a ridge stripe according to a pattern of a mask of an insulating film can be formed. However, on a surface which is etched, a Si based residue is attached, and the Si based residue which is attached will prevent crystal growth of a current blocking layer in following step. Therefore, it is necessary to remove the Si based residue which is attached. For example, according to Patent Document 1, by using an acid solution, a Si based residue which is attached on a surface which is etched is removed. Further, according to Patent Document 2, by oxidizing a Si based residue to be a Si oxide, the Si oxide is removed by diluted BHF.

PRIOR ART DOCUMENT

Patent Document

Patent Document 1: JP2002-57142A
Patent Document 2: JP2013-172059A

SUMMARY OF THE INVENTION

Problems to be Solved by the Invention

Regarding semiconductor lasers for communication, high-speed modulation has been progressing, a characteristic which is required as a laser has been strict. In order to stabilize characteristic more, the configuration of a semiconductor laser has been complicated and also requirement of stabilizing a width of a ridge stripe configuration, for example, has been strict.

According to Patent Document 1, a plasma irradiation to a Si based residue, using a material gas containing at least one of $O_2$ gas or $N_2$ gas, is performed, and then, by using an acid solution, a Si based residue is removed, however, there is a problem such that a Si based residue cannot be removed sufficiently. Further, according to Patent Document 2, a Si based residue is oxidized using $O_2$ plasma, etc., and then, a Si oxide is removed by using diluted BHF. According to the above mentioned method, a Si based residue can be removed completely, however, there is a problem such that an insulating film is etched by diluted BHF and a mask width might be changed. A width of an active layer will affect a characteristic of a laser greatly, therefore, controlling of size is important.

This application is made in order to solve the above mentioned problems, and aims to provide a method for manufacturing an optical semiconductor device such as an embedded type semiconductor laser for communication wherein a Si based residue, which is attached on a surface which is etched after a ridge stripe configuration is formed, is removed certainly without changing a width of a mask of an insulating film or without losing a mask of an insulating film.

Means for Solving Problems

A method for manufacturing an optical semiconductor device which is disclosed by this application is a method for manufacturing an optical semiconductor device having a ridge stripe configuration containing an active layer and current blocking layers which embed both sides of the ridge stripe configuration, and the method comprises steps of forming a mask of an insulating film on a surface of a semiconductor layer containing an active layer, forming a ridge stripe configuration by etching a semiconductor layer using gas containing $SiCl_4$, removing an oxide layer of a Si based residue which is attached on a surface which is etched of a ridge stripe configuration which is formed and removing a Si based residue whose oxide layer is removed.

Effects of Invention

According to a method for manufacturing an optical semiconductor device which is disclosed by this application, there is an effect such that a Si based residue which is attached on a surface which is etched after a ridge stripe configuration is formed can be removed certainly without changing a width of a mask of an insulating film or without losing a mask of an insulating film.

MODE FOR CARRYING OUT THE INVENTION

Embodiment 1

Figure 6:
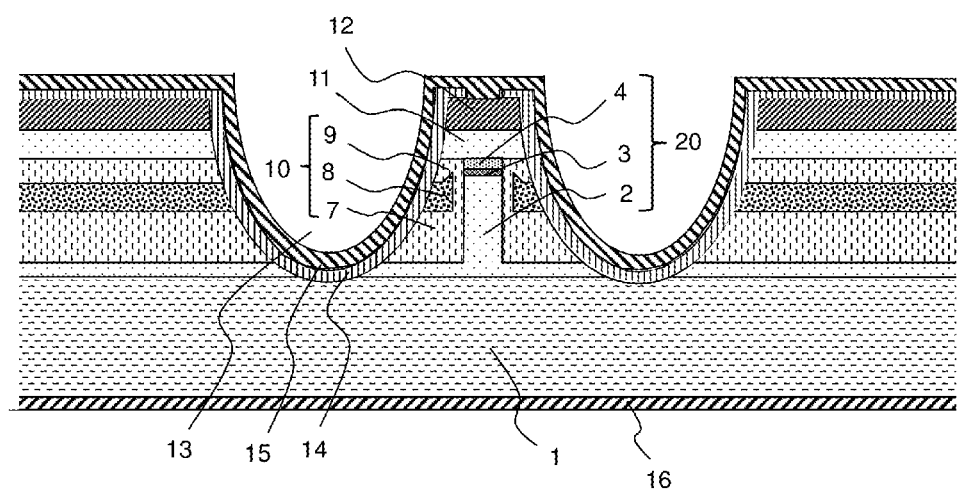
FIG. 6 is the fifth sectional view for describing a process of a method for manufacturing an optical semiconductor device according to Embodiment 1.

First, an example of a configuration of an optical semiconductor device having a ridge stripe configuration to which a method for manufacturing an optical semiconductor device of this application is applied is described. FIG. 6 is a sectional view of an embedded type semiconductor laser for communication as an optical semiconductor device. Regarding an embedded type semiconductor laser, at a side of a surface of a semiconductor substrate 1 on whose back surface, a second electrode 16 is formed, a ridge stripe configuration 20, in which a first cladding layer 2, an active layer 3 and a second cladding layer 4 are layered in this order from a side of the semiconductor substrate 1, is formed. The first cladding layer 2 is formed of a first conductive type semiconductor, and the second clad layer 4 is formed of a second conductive type semiconductor whose conductive type is reverse to the first conductive type. The ridge stripe configuration 20 is a configuration which extends in a stripe state with constant ridge width in a direction which is perpendicular to a paper surface. A side surface of the ridge stripe configuration 20 is embedded with a current blocking layer 10 which is formed of a second conductive type semiconductor layer 7, a first conductive type semiconductor layer 8 and a second conductive type semiconductor layer 9 in this order from a side of the semiconductor substrate 1. At top which is opposite side of the semiconductor substrate 1 of the ridge strip configuration 20 and at top of the current blocking layer 10, a second conductive type upper cladding layer 11 is formed, and on a surface of the upper clad layer 11, a second conductive type contact layer 12 is formed. At both sides on which the current blocking layer 10, the upper cladding layer 11 and the contact layer 12 are formed, a groove 13, which reaches the semiconductor substrate 1, is formed. A surface on which the groove 13 is formed and which contains the contact layer 12 is covered with an insulating film 14 which has an opening at center part of a surface of the contact layer 12, and the outside is covered with a first electrode 15. That is, the contact layer 12 and the first electrode 15 are electrically contacted at a part of opening of the insulating film 14.

Figure 1:
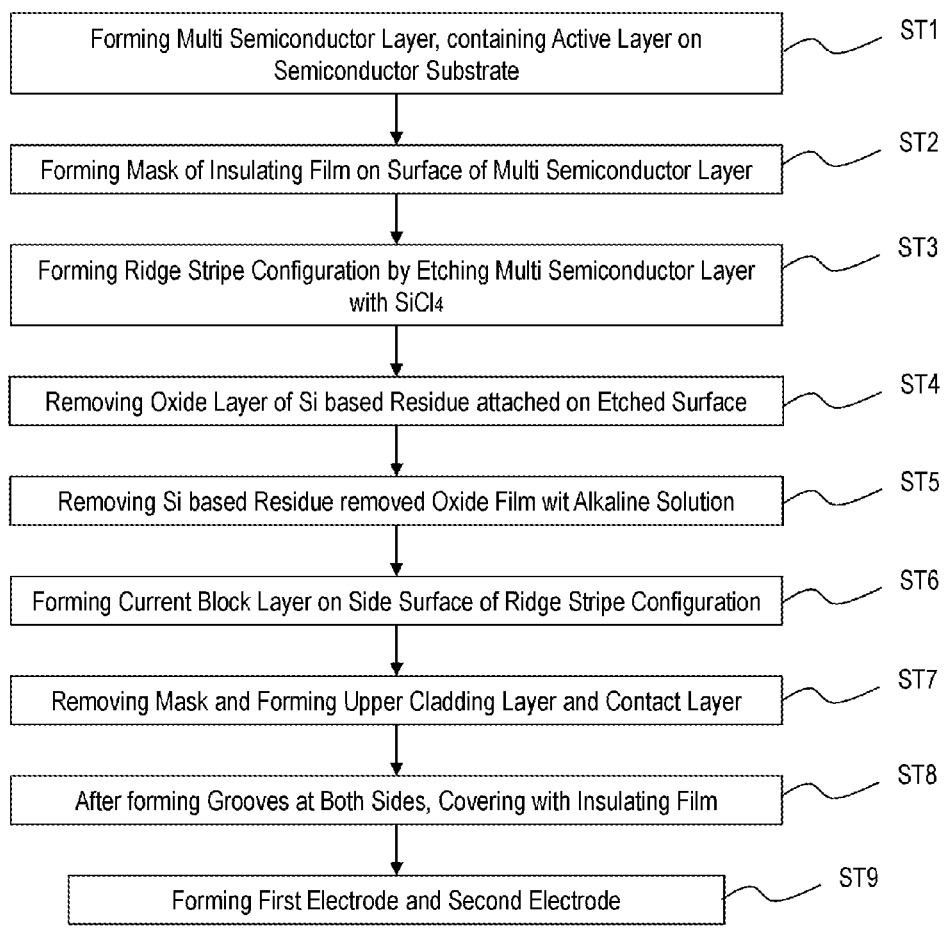
FIG. 1 is flow chart showing a method for manufacturing an optical semiconductor device according to Embodiment 1.
Figure 2:
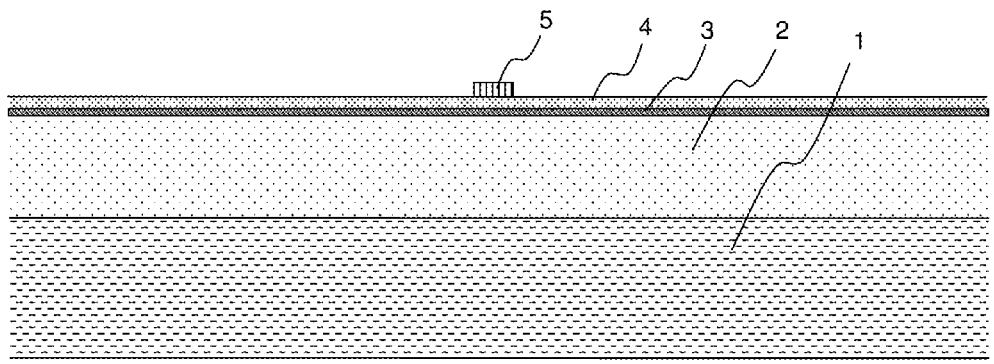
FIG. 2 is the first sectional view for describing a process of a method for manufacturing an optical semiconductor device according to Embodiment 1.
Figure 3:
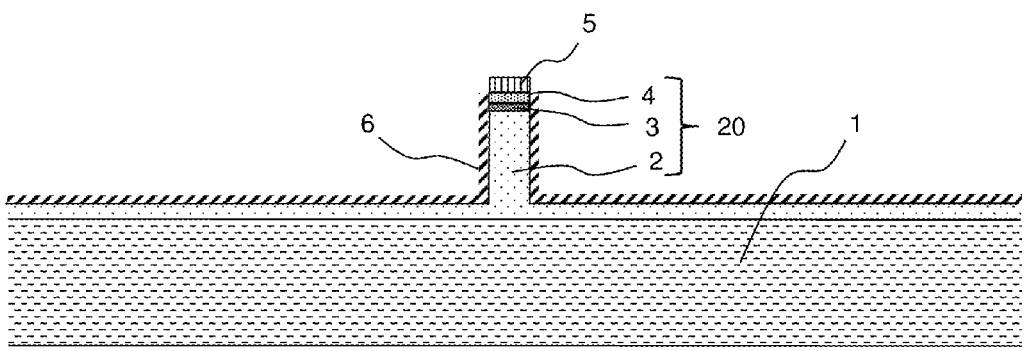
FIG. 3 is the second sectional view for describing a process of a method for manufacturing an optical semiconductor device according to Embodiment 1.

A method for manufacturing an optical semiconductor device according to Embodiment 1, which manufactures the above mentioned optical semiconductor device, is described referring flow chart of FIG. 1, and FIGS. 2 to 5 which show each process with sectional view. First, as shown in FIG. 2, on a surface of the semiconductor substrate 1, the first conductive type first cladding layer 2, the active layer 3 and the second conductive type second cladding layer 4 are layered (Step ST1 of FIG. 1). Next, a mask of an insulating film 5 is formed on the second cladding layer 4 (Step ST2). An insulating film is, for example, $SiO_2$. Next, at least the second cladding layer 4 and the active layer 3 are etched so as to form the ridge stripe configuration 20 (Step ST3). FIG. 3 is a sectional view after etching. FIG. 3 shows the state in which a ridge stripe configuration is formed wherein a part of the first cladding layer 2 is also etched, on a surface of the semiconductor substrate 1, the first cladding layer 2 remains. Etching is performed using mixed gas of $SiCl_4$ and Ar. As shown in FIG. 3, on a surface which is etched, $SiCl_4$ or a Si based residue 6 which is an insulating film origin is attached.

Figure 4:
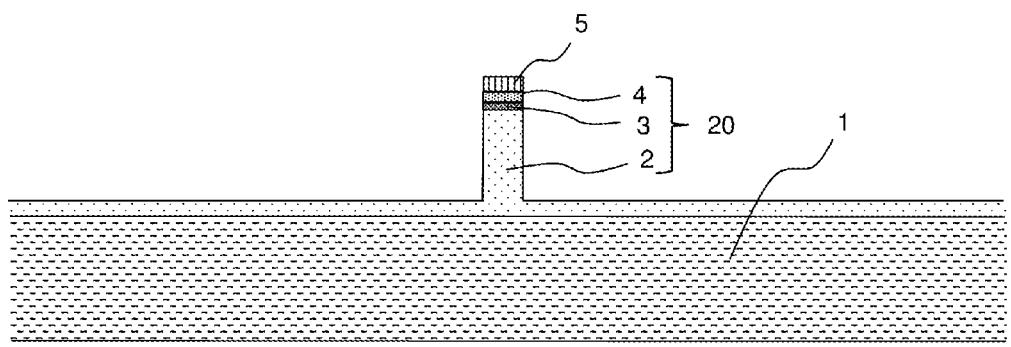
FIG. 4 is the third sectional view for describing a process of a method for manufacturing an optical semiconductor device according to Embodiment 1.

Next, a treatment with diluted hydrochloric acid is performed, and an oxide layer on a surface of the Si based residue 6 is removed (Step ST4). After that, a treatment with an alkaline solution is performed, and a Si based residue whose oxide layer is removed is removed (Step ST5). FIG. 4 is a sectional view after the Si based residue is removed. As an alkaline solution, for example, KOH is used. As an alkaline solution, in addition to KOH, by using, for example, a solution of TMAH (tetramethylammonium hydroxide $(CH_3)_4NOH$), same effect can be obtained.

Figure 5:
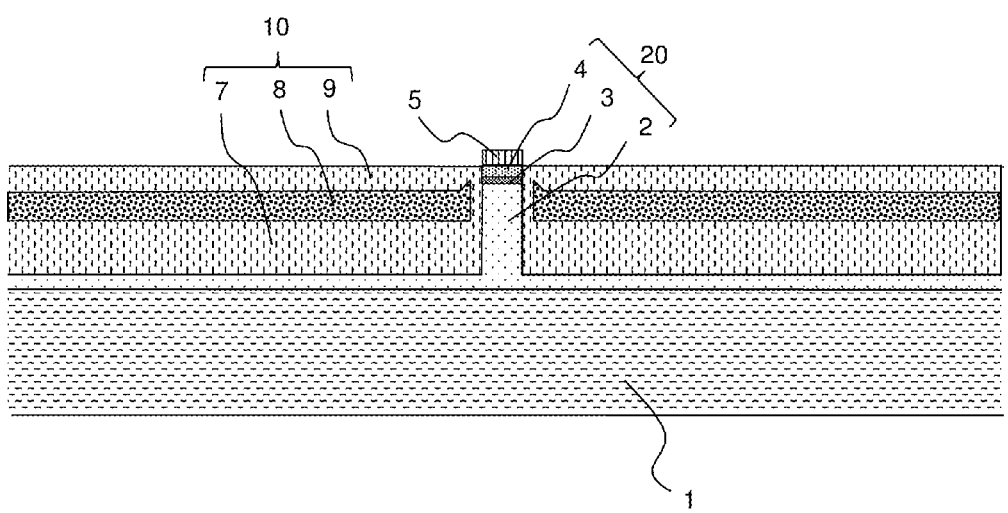
FIG. 5 is the fourth sectional view for describing a process of a method for manufacturing an optical semiconductor device according to Embodiment 1.

Next, the mask of an insulating film 5 is used as a mask of selective crystal growth, a second conductive type semiconductor layer 7, a first conductive type semiconductor layer 8 and a second conductive type semiconductor layer 9 are layered to form a current blocking layer 10 (Step ST6). The mask of an insulating film 5 is not melted by alkaline solution in step ST5, and a mask width is not changed. Consequently, a process of selective crystal growth in step ST6 is not affected. FIG. 5 is a sectional view showing the state after the current blocking layer 10 is formed.

Next, the mask of an insulating film 5 is removed, and at an upper part of the current blocking layer 10 and the second cladding layer 4, the second conductive type upper cladding layer 11 is formed, and further at top of the above mentioned, the second conductive type contact layer 12 is formed (Step ST7). Next, a groove 13, which reaches the semiconductor substrate 1 from the contact layer 12 on the current blocking layer 10 at both sides of the ridge stripe configuration, is formed, and whole of that is covered with an insulating film 14 having an opening at a part of the contact layer 12 (Step ST8). On the insulating film 14 and an upper part of the contact layer 12, a first electrode 15 is formed, and at back surface of the semiconductor substrate 1, a second electrode 16 is formed (Step ST9). As above mentioned, an embedded type semiconductor laser as an optical semiconductor device shown in FIG. 6 is manufactured.

A Si based residue 6 which is formed on a surface which is etched in Step ST3 prevents crystal growth of the current blocking layer 10 which is performed in following step ST6. A Si based residue can be removed by using fluorine based chemical, however, at the same time, the mask of an insulating film 5 is also removed. According to Patent Document 1, a Si based residue is removed by performing plasma irradiation using a material gas containing at least $O_2$ gas or $N_2$ gas to a Si based residue and then using an acid solution, however, a Si based residue cannot be removed completely by using an acid solution. According to Patent Document 2, a Si based residue is oxidized by using $O_2$ plasma, etc., then using diluted BHF so as to remove an Si oxide. According to the above mentioned method, a Si based residue can be removed, however, a mask of an insulating film is etched with diluted BHF and a mask width is changed. On the other hand, in Embodiment 1, in Step ST4, an oxide layer on a surface of a Si based residue 6 which is attached on a surface which is etched is removed by using diluted hydrochloric acid, and then the Si based reside whose oxide layer is removed, is treated with alkaline solution so as to be removed. An oxide layer is removed by performing a diluted hydrochloric acid treatment so as to make the state of a Si based residue to be able to be solved easily with an alkaline solution. According to the above mentioned treatment, a Si based residue can be removed without losing a mask of an insulating film for selective growth 5 or without changing a size of the mask.

As above mentioned, according to a method for manufacturing an optical semiconductor device in Embodiment 1, after an oxide layer of a Si based residue, which is attached by performing etching, is removed, and a Si based residue is removed by an alkaline solution, therefore, a Si based residue can be removed without losing the mask of an insulating film for selective growth or without changing a size of the mask. Consequently, a process for removing a Si based residue will not affect a following process for forming the current blocking layer 10, as a result, characteristics of an optical semiconductor device can be stabilized.

Embodiment 2

Figure 7:
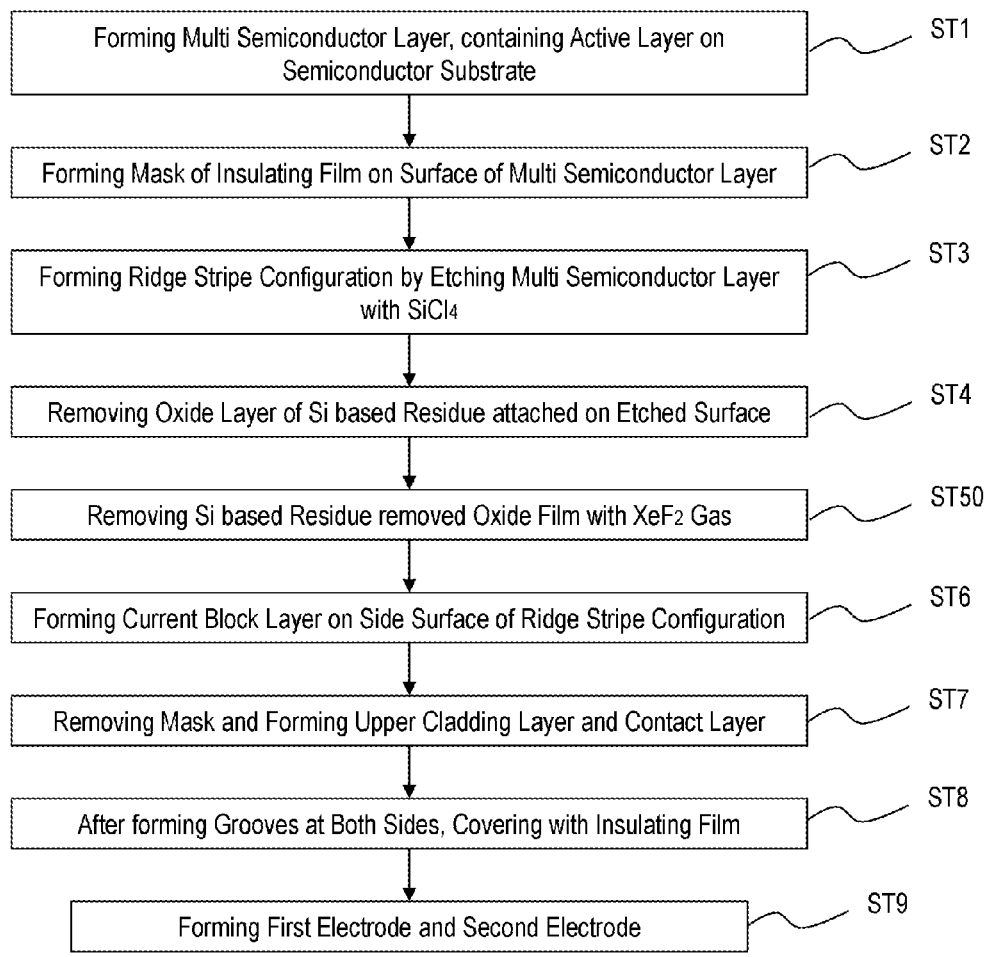
FIG. 7 is flow chart showing a method for manufacturing an optical semiconductor device according to Embodiment 2.

A method for manufacturing an optical semiconductor device according to Embodiment 2 is described referring flow chart of FIG. 7. A point which is different from Embodiment 1 is such that step ST5 is changed to be step ST50 only, and Steps ST1 to ST4 and steps ST6 to ST9 are same as those of Embodiment 1. That is, first, on a surface of a multi semiconductor layer containing an active layer which is formed on a semiconductor substrate (Step ST1), a mask of an insulating film is formed (Step ST2), and the multi semiconductor layer is etched by $SiCl_4$ to form a ridge stripe configuration (Step ST3). After that, an oxide layer on a surface of a Si based residue which is attached on a surface which is etched is removed by performing a diluted hydrochloric acid treatment (Step ST4).

Next, a $XeF_2$ gas treatment is performed and a Si based residue whose oxide layer is removed is removed (Step ST50). A $XeF_2$ gas treatment is non plasma treatment and etching of a Si based residue whose oxide layer is removed can be performed, and further a mask of an insulating film 5 such as $SiO_2$ is not etched at all. Consequently, selective crystal growth in following Step ST6 will not be affected. A state where after a Si based residue is removed is the same as a sectional view of FIG. 4 shown in Embodiment 1.

Next, regarding a mask of an insulating film 5 as a mask of selective crystal growth, a current blocking layer 10 on which a second conductive type semiconductor layer 7, a first conductive type semiconductor layer 8 and a second conductive type semiconductor layer 9 are layered is formed (Step ST6). Next, the mask of an insulating film 5 is removed, at an upper part of the current blocking layer 10 and the second cladding layer 4, a second conductive type upper part cladding layer 11 is formed, and further at an upper part of the upper part cladding layer 11, a second conductive type contact layer 12 is formed (Step ST7). Next, a groove 13, which reaches from the contact layer 12 which is formed on the current blocking layer 10 at both sides of a ridge stripe configuration to a semiconductor substrate 1, is formed, and whole of that is covered with an insulating film 14 having an opening at a part of the contact layer 12 (Step ST8). On the insulating film 14 and an upper part of the contact layer 12, a first electrode 15 is formed and at a back surface of the semiconductor substrate 1, a second electrode 16 is formed (Step ST9).

As above mentioned, according to a method for manufacturing an optical semiconductor device in Embodiment 2, after an oxide layer of a Si based residue which is attached due to etching is removed, a Si based residue is removed by performing a $XeF_2$ gas treatment, therefore, in the same way as that of Embodiment 1, without losing a mask of an insulating film for selective growth or without changing of size of a mask, a Si based residue can be removed. Therefore, a process for removing a Si based residue will not affect a following process for forming the current blocking layer 10, consequently, characteristic stabilization of an optical semiconductor device can be realized.

In this application, various exemplary embodiments and examples are described, however, various characteristic, aspects and functions which are described in one or a plurality of embodiments are not limited to application of specific embodiments and can be applied to one or a combination of embodiments. Consequently, numerous modifications, which are not exemplified within a scope of technology which is disclosed in this specification, are assumed. For example, in a case where at least one component is modified, a case to be added, a case to be omitted, further, a case in which at least one component is extracted to be combined with a component of other embodiment is included.

What is claimed is:
1. A method for manufacturing an optical semiconductor device having a ridge stripe configuration containing an active layer and current blocking layers which embed both sides of the ridge stripe configuration comprising steps of:
   forming a mask of an insulating film on a surface of a semiconductor layer containing an active layer,
   forming a ridge stripe configuration by etching the semiconductor layer by using gas containing $SiCl_4$,
   removing an oxide layer of a Si based residue which is attached on a surface which is etched of the ridge stripe configuration which is formed, and
   removing the Si based residue whose oxide layer is removed.

2. The method for manufacturing an optical semiconductor device according to claim 1, wherein in the step of removing the Si based residue, the Si based residue is removed by using an alkaline solution.

3. The method for manufacturing an optical semiconductor device according to claim 2, wherein the alkaline solution is KOH solution or TMAH solution.

4. The method for manufacturing an optical semiconductor device according to claim 1, wherein in the step of removing the Si based residue, the Si based residue is removed by performing a $XeF_2$ gas treatment.

5. The method for manufacturing an optical semiconductor device according to claim 1, wherein in the step of removing the oxide layer of the Si based residue, hydrochloric acid is used to remove the oxide layer.

* * * * *